(12) United States Patent
Dray et al.

(10) Patent No.: US 7,630,264 B2
(45) Date of Patent: Dec. 8, 2009

(54) MEMORY DEVICE AND TESTING WITH WRITE COMPLETION DETECTION

(75) Inventors: Cyrille Dray, Antibes (FR); Stephany Bouniol, Mougins (FR); Magali Hage Hassan, Grasse (FR); Luc Palau, Grasse (FR)

(73) Assignee: Infineon Technologies AG, Neubiberg (DE)

( * ) Notice: Subject to any disclaimer, the term of this patent is extended or adjusted under 35 U.S.C. 154(b) by 63 days.

(21) Appl. No.: 11/782,418

(22) Filed: Jul. 24, 2007

(65) Prior Publication Data

US 2009/0027987 A1 Jan. 29, 2009

(51) Int. Cl.
*G11C 7/02* (2006.01)
(52) U.S. Cl. ............... 365/210.1; 365/154; 365/189.16
(58) Field of Classification Search ................ 365/154, 365/189.16, 210.1
See application file for complete search history.

(56) References Cited

U.S. PATENT DOCUMENTS

| | | | |
|---|---|---|---|
| 6,483,754 B1 * | 11/2002 | Agrawal | ............... 365/189.04 |
| 6,711,076 B2 | 3/2004 | Braceras | |
| 6,778,450 B2 | 8/2004 | Selvin et al. | |
| 6,999,367 B2 * | 2/2006 | Yamagami | ............... 365/210.1 |
| 7,133,319 B2 | 11/2006 | Wuu et al. | |
| 7,301,840 B2 * | 11/2007 | Yamagami | ............... 365/210.1 |
| 2007/0263447 A1 * | 11/2007 | Koike et al. | ............ 365/185.18 |

* cited by examiner

*Primary Examiner*—Hoai V Ho
(74) *Attorney, Agent, or Firm*—Banner & Witcoff, Ltd.

(57) ABSTRACT

An apparatus including a memory cell, a reference cell, a control unit, coupled to the memory cell and the reference cell, and configured to initiate write processes of the memory cell and the reference cell, and a detection unit, coupled to the reference cell, and configured to detect a write completion of the reference cell. Related methods are also disclosed.

17 Claims, 7 Drawing Sheets

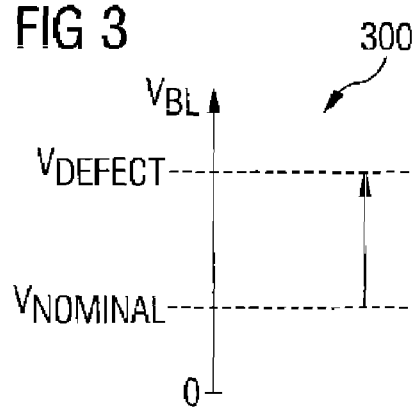
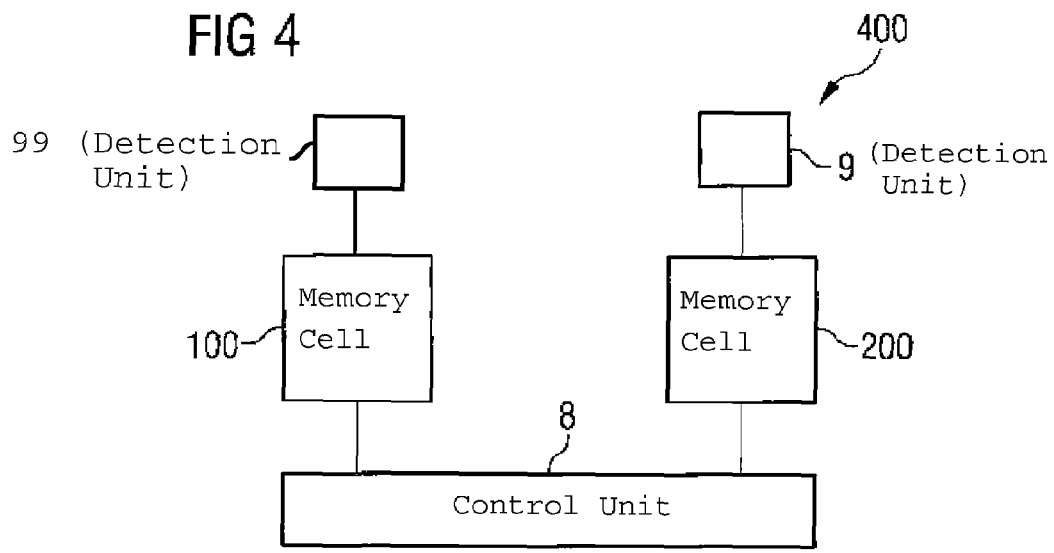
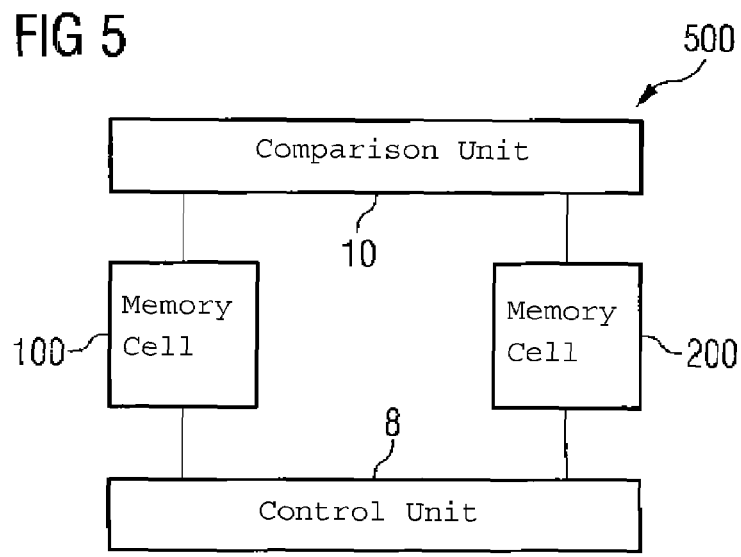

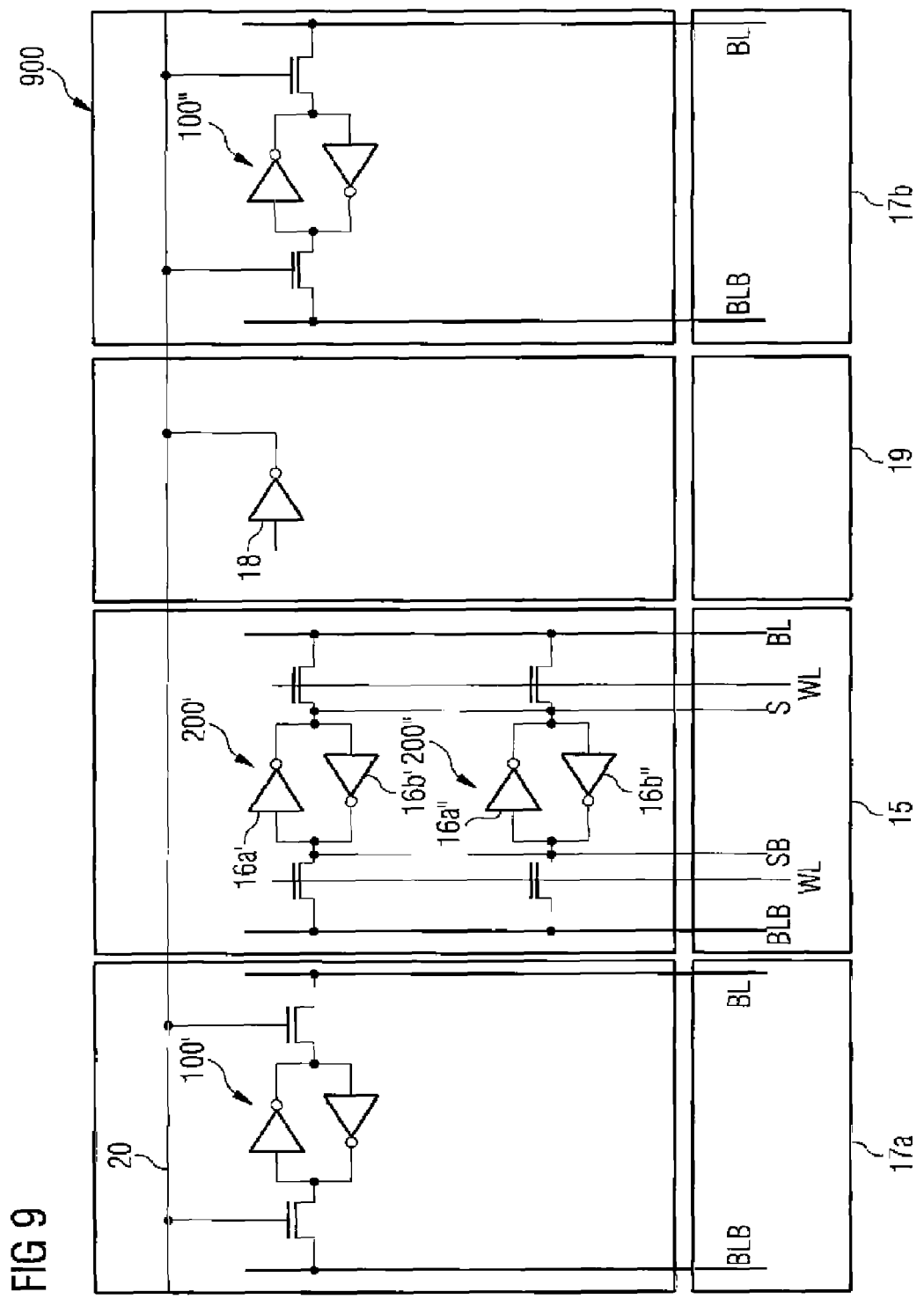

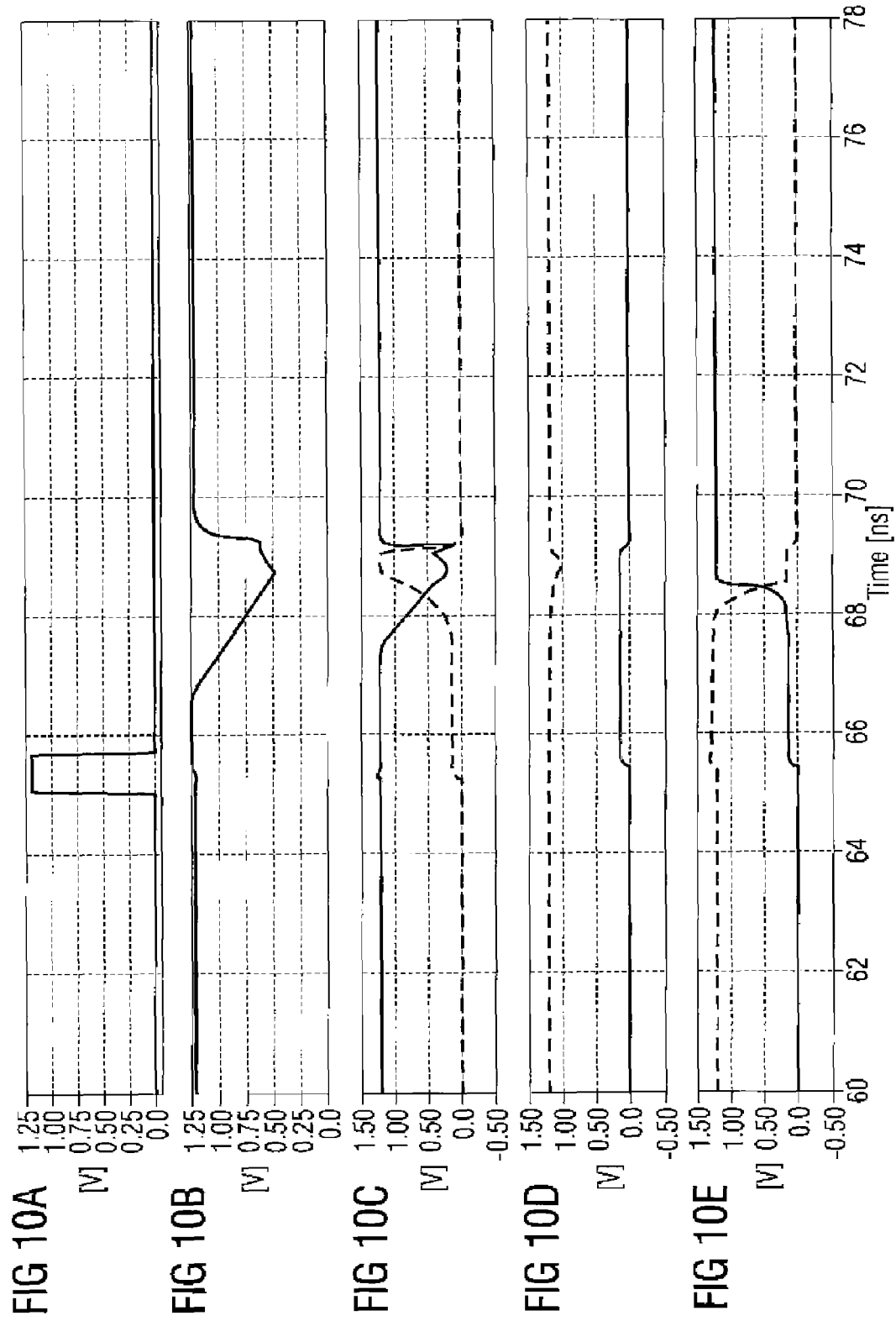

MEMORY DEVICE AND TESTING WITH WRITE COMPLETION DETECTION

BACKGROUND

Memory devices, such as SRAM (Static Random Access Memory) memory devices, have an array of memory cells that often employ cross-coupled devices, such as inverters, to store data. A memory device may include a plurality of memory cells that may be arranged in an array.

Memory cell arrays may include defective memory cells. Accordingly, it may be desirable to be able to detect and even replace the defective memory cells with substitution memory cells.

SUMMARY

According to some aspects as described herein, various embodiments of an apparatus (and a related method) are provided that include a memory cell, a reference cell, a control unit, coupled to the memory cell and the reference cell, and configured to initiate write processes of the memory cell and the reference cell, and a detection unit, coupled to the reference cell, and configured to detect a write completion of the reference cell.

These and other aspects of the disclosure will be apparent upon consideration of the following detailed description of illustrative aspects.

BRIEF DESCRIPTION OF THE DRAWINGS

A more complete understanding of the present disclosure may be acquired by referring to the following description in consideration of the accompanying drawings, in which like reference numbers indicate like features, and wherein:

FIG. 3 schematically illustrates write margins of the memory cells 100 and 200.

FIG. 4 schematically illustrates a device 400 as an exemplary embodiment.

FIG. 5 schematically illustrates a device 500 as a further exemplary embodiment.

FIG. 9 schematically illustrates a device 900 as a further exemplary embodiment.

FIG. 10a schematically illustrates a voltage characteristic of a clock pulse.

FIG. 10b schematically illustrates a voltage characteristic of a bitline during a bitline discharge.

FIG. 10c schematically illustrates a voltage characteristic of two storage nodes of a reference cell during a bitline discharge.

FIG. 10d schematically illustrates a voltage characteristic of two storage nodes of a stable (i.e., non-defective) memory cell during a bitline discharge.

FIG. 10e schematically illustrates a voltage characteristic of two storage nodes of an unstable (i.e., defective) memory cell during a bitline discharge.

DETAILED DESCRIPTION

Figure 1:
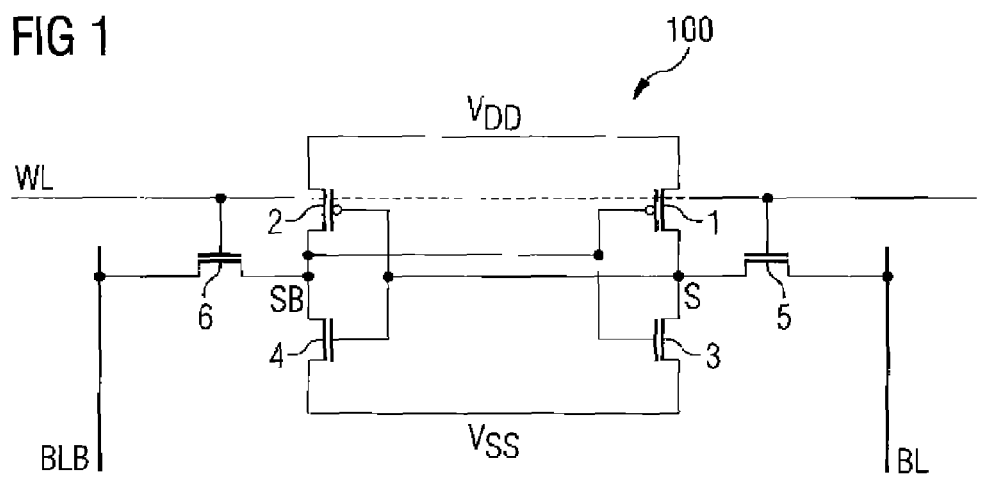
FIG. 1 schematically illustrates an SRAM memory cell 100.

In the following, various illustrative embodiments are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of embodiments. It will be evident to a person skilled in the art, however, that one or more aspects of the embodiments may be practiced with a lesser degree of these specific details. In other instances, known structures and devices are shown in block diagram form in order to facilitate describing one or more aspects of the embodiments. The following description is therefore not to be taken in a limiting sense, and the scope of the application is defined by the appended claims.

Devices including memory cells are described below, wherein the scope of the application shall not be restricted by the particular embodiment of the employed memory cells. An illustrative embodiment of a memory cell is a RAM (Random Access Memory) cell, e.g., an SRAM (Static Random Access Memory) cell. It is understood that various kinds of SRAM cells may be implemented. For example, the SRAM cell may be a 4T-SRAM cell, a 6T-SRAM cell or an 8T-SRAM cell. Further embodiments are known to a person skilled in the art and may be employed accordingly.

The described devices may be made of semiconductor material. However, the devices need not be fabricated from one specific semiconductor material and, furthermore, may contain inorganic and/or organic materials that are not semiconductors, such as for example insulators, plastics or metals. Moreover, the devices may be packaged or unpackaged.

FIG. 1 schematically illustrates an example of an SRAM memory cell 100 on a transistor level. SRAM memory cells are known to persons skilled in the art and are described in the following on a basic level. The memory cell 100 as shown includes two pFETs (p-channel Field Effect Transistors) 1, 2 and four nFETs (n-channel Field Effect Transistors) 3 to 6, wherein the FETs 1 to 6 may be implemented in the form of MOSFETs (Metal Oxide Semiconductor Field Effect Transistors). The FETs 1 to 4 are arranged between a first supply voltage $V_{DD}$ and a second supply voltage $V_{SS}$. The second supply voltage $V_{SS}$ is lower than the first supply voltage $V_{DD}$ and preferably corresponds to a ground potential. The FETs 1 and 3 as well as the FETs 2 and 4 respectively act as inverters when connected to each other as shown in FIG. 1.

The two inverters formed by the FETs 1 to 4 are cross-coupled and represent the memory storage portion of the memory cell 100. The input of the left inverter (i.e. the two FETs 2 and 4) is connected to the output of the right inverter (i.e. the two FETs 1 and 3) and provides a storage node S for the storage of a binary data value. In a similar way, the input of the right inverter is connected to the output of the left inverter and provides a storage node SB for the storage of a binary data value that is complementary to the data value of the storage node S. Accordingly, a binary data value '0' stored in the memory cell 100 may be represented by the storage node S having the second supply voltage $V_{SS}$ and the storage node SB having the first supply voltage $V_{DD}$. Furthermore, a binary data value '1' may be represented by the storage node S having the first supply voltage $V_{DD}$ and the storage node SB having the second supply voltage $V_{SS}$.

The two transistors 5 and 6 are configured to control the access to the storage nodes S and SB. Due to connections of the transistors 5 and 6 to bitlines BL and BLB, the memory state stored in the memory cell 100 may be written by an external component (not shown) coupled to the bitlines BL and BLB. The gates of the transistors 5 and 6 are connected to a wordline WL, wherein a write or read process of the memory cell 100 is enabled by a signal on the wordline WL that activates access to the memory cell 100.

A memory device that may, for example, be used in a computer system may include multiple memory cells 100 that may be arranged in an array including columns and rows. Here, the columns are connected by bitlines, while the rows are connected by wordlines. In order to store a memory state in one specific memory cell of the array, the wordline connected to the memory cell is activated, such as by providing the cell with a high-level signal. The actual writing of the memory state in the memory cell may be then carried out by accessing the memory cell over the bitlines, thereby changing the voltages at the storage nodes. A memory state may be written when the voltages $V_{SS}$ and $V_{DD}$ at the two nodes S and SB are reversed. Discharging or charging the bitlines BL and BLB may lead to a change of the voltages at the storage nodes S and SB.

Figure 2:
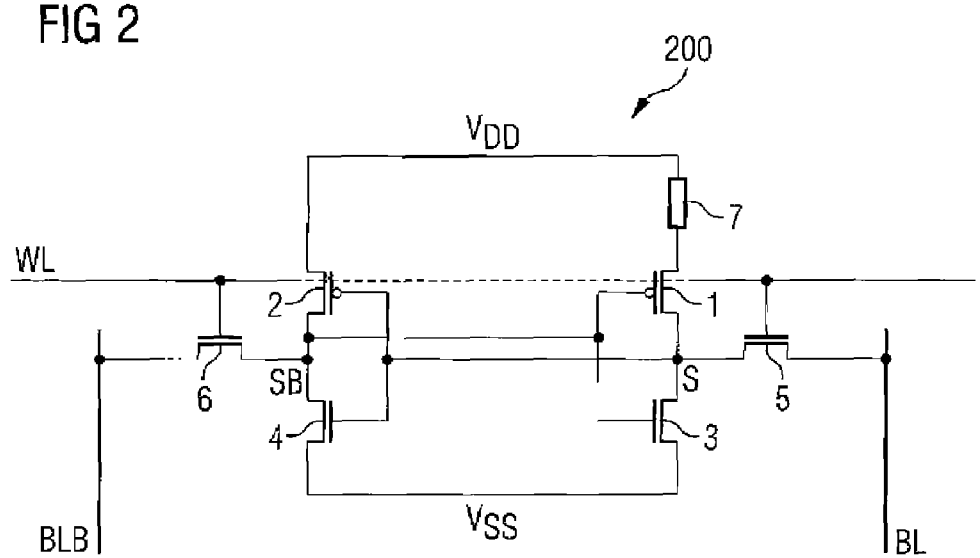
FIG. 2 schematically illustrates an SRAM memory cell 200 including a defect.

FIG. 2 schematically illustrates an example of an SRAM memory cell 200 including a defect 7. Similar to the memory cell 100, the memory cell 200 is capable of storing a binary memory state. In contrast to the memory cell 100, the memory cell 200 includes a defect 7 indicated in FIG. 2 by a resistor symbol. The defect 7 in the memory cell 200 may, for example, be caused by inaccuracies of its fabrication process and may generally be located at arbitrary places of the memory cell 200. The defect 7 may be of symmetrical or asymmetrical form and may for example include, source/drain dislocations or missing connections to the FET devices. Since the effect of a defect in a memory cell is comparable to the effect of an additional resistor, the defect 7 is depicted by a resistor symbol.

FIG. 3 schematically illustrates a graph 300 showing illustrative write margins of the memory cells 100 and 200. As already mentioned in the preceding paragraphs, writing a memory state into a memory cell is achieved by changing the voltage at the storage node S from $V_{DD}$ to $V_{SS}$ or vice versa. For changing the voltage at the storage node S from $V_{DD}$ to $V_{SS}$, the voltage $V_{BL}$ on the bitline BL (assumed to be precharged to the first supply voltage of $V_{DD}$) is decreased, i.e. the bitline BL is discharged. While discharging the bitline BL the voltage at the storage node S decreases and at a certain voltage $V_{BL}$ of the bitline BL, the memory state at the storage node S changes, i.e. its voltage has reached the value $V_{SS}$. Due to the inverting character of the two transistors 2 and 4, the voltage at the storage node SB has changed in a complementary way. The bitline voltage $V_{BL}$ that is required to write the memory state of a memory cell is referred to as the write margin of the memory cell.

The write margin may be generally different for different memory cells due to inaccuracies of their respective fabrication processes. Accordingly, the write margins of the two memory cells 100 and 200 may differ as well, wherein the write margin $V_{DEFECT}$ of the memory cell 200 including the defect 7 is in this case greater than the write margin $V_{NOMINAL}$ of the nominal memory cell 100 without defect. Accordingly, during the described discharging of the bitline BL the writing of the memory state into the memory cell 200 including the defect 7 is completed earlier than the writing of the memory state into the nominal memory cell 100. The two values $V_{DEFECT}$ and $V_{NOMINAL}$ are depicted in FIG. 3 without the use of a specific scaling.

FIG. 4 schematically illustrates an illustrative embodiment of a device 400 including a memory cell 100 that may be similar to the memory cell shown in FIG. 1 and a reference cell 200 that may be similar to the memory cell shown in FIG. 2. Both cells 100 and 200 are coupled to a control unit 8 which is configured to initiate write processes of the cells 100 and 200. The device 400 further includes a detection unit 9 coupled to the reference cell 200 in order to detect a write completion of the reference cell 200.

The device 400 may, inter alia, be used to test the memory cell 100. For this purpose, the control unit 8 may initiate write processes of the cells 100 and 200. Both write processes may be terminated once the write completion of the reference cell 200 is detected by the detection unit 9. The memory cell 100 may be evaluated by considering its memory state after the termination of the write process.

FIG. 5 schematically illustrates a further illustrative embodiment of a device 500 including a memory cell 100, a reference cell 200 and a control unit 8. The cells 100 and 200 may be similar to the cells 100 and 200 shown in FIGS. 1 and 2, respectively. The control unit 8 is coupled to the cells 100 and 200 to initiate write processes. The device 500 further includes a comparison unit 10 configured to compare a write margin of the memory cell 100 and a write margin of the reference cell 200. The device 500 may, inter alia, be used to provide the possibility for testing the memory cell 100. For this purpose, the control unit 8 may initiate write processes of the memory cell 100 and the reference cell 200. A comparison of the write margins of the cells 100 and 200 may be performed by the comparison unit 10. It is to be noted that this comparison does not necessarily imply an explicit knowledge of the write margins of the two cells 100 and 200. For example, the comparison unit 10 may also be configured to simply detect which of the two write processes is completed earlier. On the basis of this information, an evaluation of the stability of the memory cell 100 may be carried out.

Figure 6:
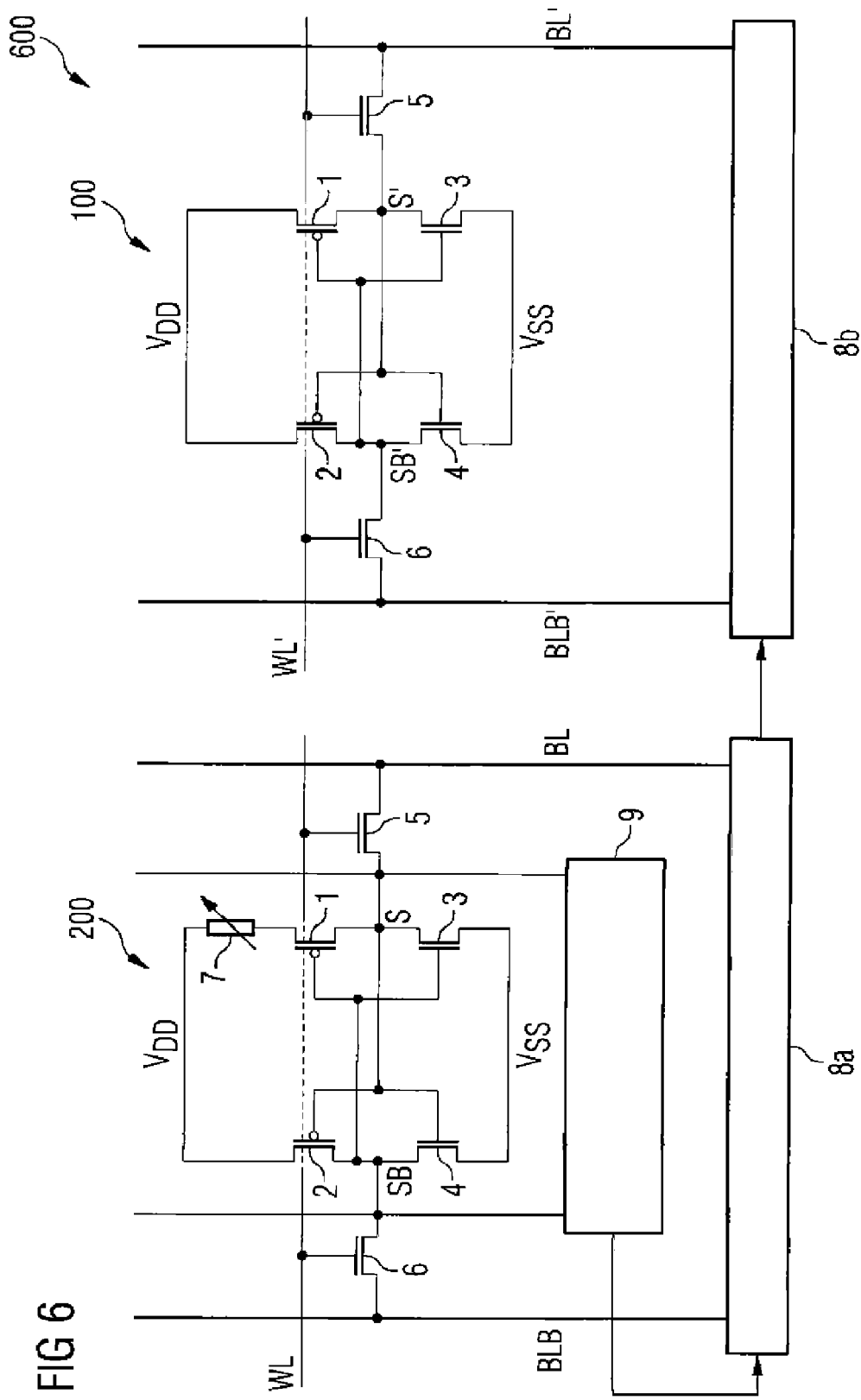
FIG. 6 schematically illustrates a device 600 as a further exemplary embodiment.

FIG. 6 schematically illustrates a further illustrative embodiment of a device 600 including a memory cell 100 as shown in FIG. 1 and a reference cell 200 similar to the one shown in FIG. 2. The reference cell 200 of FIG. 6 in this example merely differs from the memory cell 200 of FIG. 2 in the implementation of the defect 7. Compared to the defect 7 of the device 200, the defect 7 of the device 600 is an intentional defect that may be tunable. Thus, the reference cell 200 may be used to mimic a defective memory cell, the characteristics of which (in particular its write margin) may be adjusted and controlled by the properties of the simulated defect 7. It is to be noted that the term "tunable" or "adjustable" and variations thereof in this context does not necessarily mean that the defect 7 is controllable by means of an external application and/or at any desired time. Although such control may be provided, the defect 7 may instead be implemented using additional electric components that are artificially added to the memory cell 200, such as additional transistors that may alter the electric properties (in particular the write margin) of the memory cell 200 in a desired way.

The memory cell 100 is considered herein to represent a nominal memory cell, i.e. a memory cell without any artificially added defects. However, the memory cell 100 may nevertheless contain other unintended defects that may, for example, arise from inaccuracies of its fabrication process.

The reference cell 200 may be coupled to a detection unit 9 configured to detect a write completion of the reference cell 200. The detection of a write completion may, for example, be carried out by measuring and evaluating the voltages at the storage nodes S and SB. The reference cell 200 is coupled to a control unit 8a configured to initiate write processes of the reference cell 200. Similarly, the memory cell 100 may be coupled to a control unit 8b configured to initiate write processes of the memory cell 100. The two control units 8a and 8b may also be combined in a single control unit and, for example, be implemented in form of a weak write driver circuit configured to produce a bias voltage the magnitude of which may be varied continuously. In this manner, the bitlines BL, BLB, BL' and BLB' may be charged and discharged arbitrarily. In other words, these bitlines may be biased to any desired voltages that may be varied continuously.

The detection unit 9 may be coupled to the control unit 8a so that signals may be exchanged between these units. For example, if a write process (in which the voltage of the bitline BL is decreased) is finished, the detection unit 9 may send a reset signal to the control unit 8a in order to recharge the bitline BL for a further write process. Moreover, the control unit 8a may be coupled to the control unit 8b. Via this connection, the control unit 8a may, for example, instruct the control unit 8b to terminate the write process of the memory cell 100.

Figure 7:
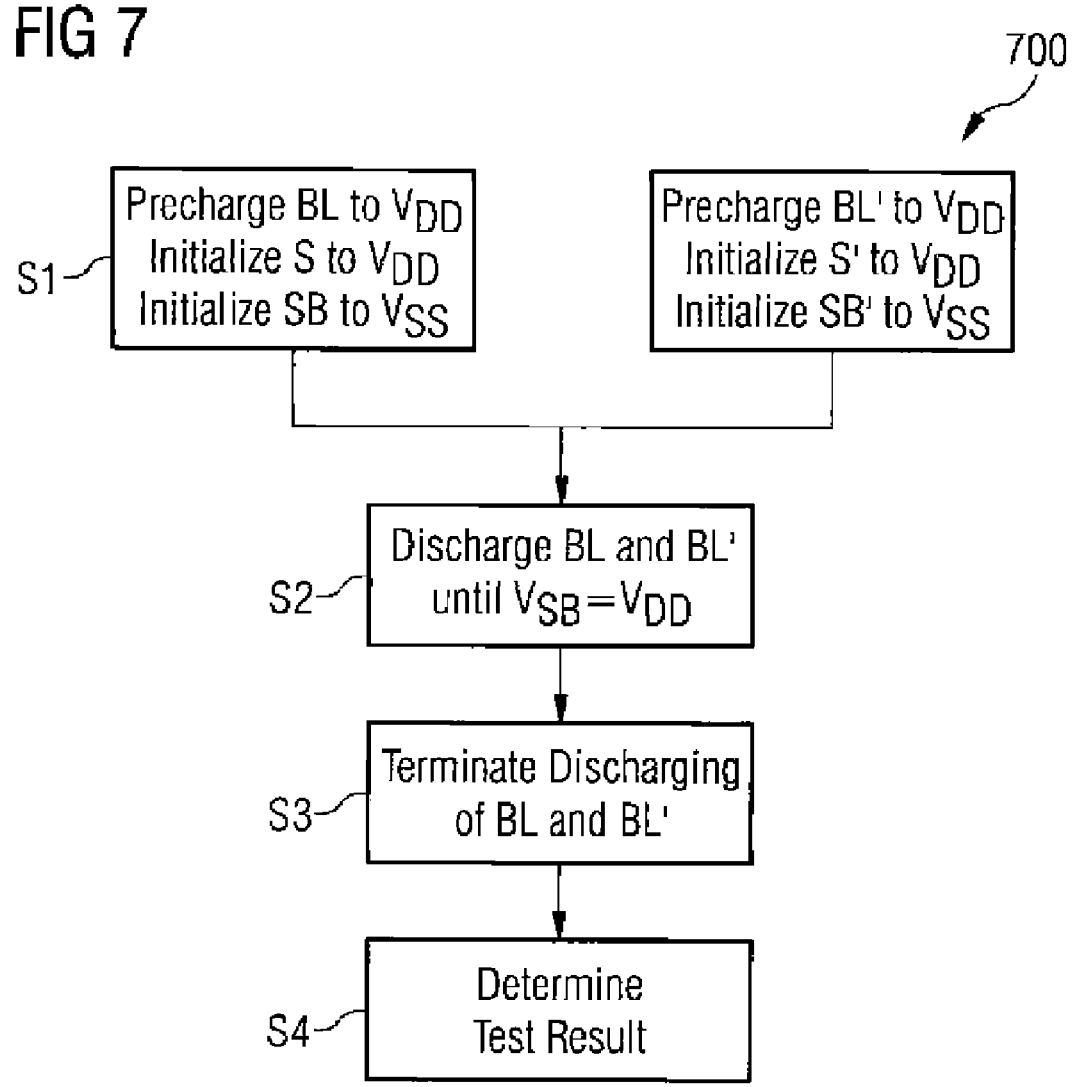
FIG. 7 schematically illustrates a process diagram 700 for testing a memory cell.

FIG. 7 schematically shows a flowchart 700 for an illustrative embodiment of a method of testing the memory cell 100. The illustrated process steps S1 to S4 refer to the components of the device 600 shown in FIG. 6. In a process step S1, the bitlines BL and BL' of the two cells 100 and 200 are precharged to the first supply voltage $V_{DD}$. Moreover, the storage nodes S and S' are initialized to the first supply voltage $V_{DD}$ and the storage nodes SB and SB' are initialized to the second supply voltage $V_{SS}$. Accordingly, the nodes S and S' represent a binary value of '1', while the storage nodes SB and SB' represent a binary value of '0'.

In a process step S2, the control units 8a and 8b initiate write processes of the cells 100 and 200 by respectively discharging the bitlines BL and BL'. During the discharging processes, the bitlines BLB and BLB' are held at voltages $V_{BLB}$ and $V_{BLB'}$ which are between $V_{SS}$ and $V_{DD}$. Here, the voltages $V_{BLB}$ and $V_{BLB'}$ are not necessarily chosen to have a constant value, but are preferably kept at a neutral level in order to avoid any influences on the write processes taking place on the bitlines BL and BL'. The discharging of the two bitlines BL and BL' may be started simultaneously.

The bitlines BL and BL' are discharged until the voltage $V_{SB}$ at the storage node SB reaches the value $V_{DD}$, while the voltage $V_S$ at the storage node S reaches the value $V_{SS}$. If the storage nodes S and SB have reached said voltages, the write process of the reference cell 200 is completed, i.e. the binary value at the storage node S has switched from '1' to '0' and the binary value at the storage node SB has switched from '0' to '1'. In practice, the write processes of the cells 100 and 200 are terminated by simply stopping the discharging of the bitlines BL and BL' (process step S3). The termination of the write processes may, for example, be initiated by the control units 8a and/or 8b. Alternatively, the device 600 may include a further control unit (which is not shown in FIG. 6) that is configured to terminate the write processes of the cells 100 and 200.

In a process step S4, the test result may be determined. In doing so, a decision may be made if the memory cell 100 is to be labeled as unstable (i.e., defective) or as stable (i.e., non-defective). The memory cell 100 may be labeled as unstable/defective if its write margin is greater than the write margin of the reference cell 200 simulating a defective memory cell. It has been stated that the write process for a memory cell having a greater write margin is finished earlier than the write process of a memory cell having a smaller write margin. Accordingly, the memory cell 100 may be labeled as stable/non-defective, if its write process was not successful. On the other hand, the memory cell 100 may be labeled as stable/non-defective if its write process was successful. For detecting the write completion of the memory cell 100, the device 600 may further include a second detection unit that is not explicitly shown in FIG. 6 but that is illustrated in FIG. 4 as detection unit 99. Detecting the write completion of the memory cell 100 may, for example, be established by a read operation to check if the memory cell 100 has been written or not.

It is to be noted that the test process illustrated in FIG. 7 may be varied. During the test process as described above, the storage nodes S and S' were initialized to a binary value of '1' that was switched to a binary value of '0' during the write process. Another possible test process may be based on a reversed write process, i.e. a switch from '0' to '1'. In this case, the test process is carried out by initializing the storage nodes S and S' to a binary value of '0' (i.e. a voltage of $V_{SS}$) and the storage nodes SB and SB' to a binary value of '1' (i.e. a voltage of $V_{DD}$). The write processes are then performed by charging the bitlines BL and BL' until the storage nodes switch to their respective complementary binary values.

During the test process as shown in FIG. 7, the bitlines BL and BL' are discharged, while the bitlines BLB and BLB' are held at a voltage level between the supply voltages $V_{SS}$ and $V_{DD}$. In other illustrative embodiments, the text process may be executed by exchanging the functionalities of the bitlines, i.e. by discharging the bitlines BLB and BLB' and keeping the bitlines BL and BL' at a voltage level between the supply voltages $V_{SS}$ and $V_{DD}$. It is to be noted that for this test process, it may be desirable to adapt the initialization of the storage nodes accordingly.

Figure 8:
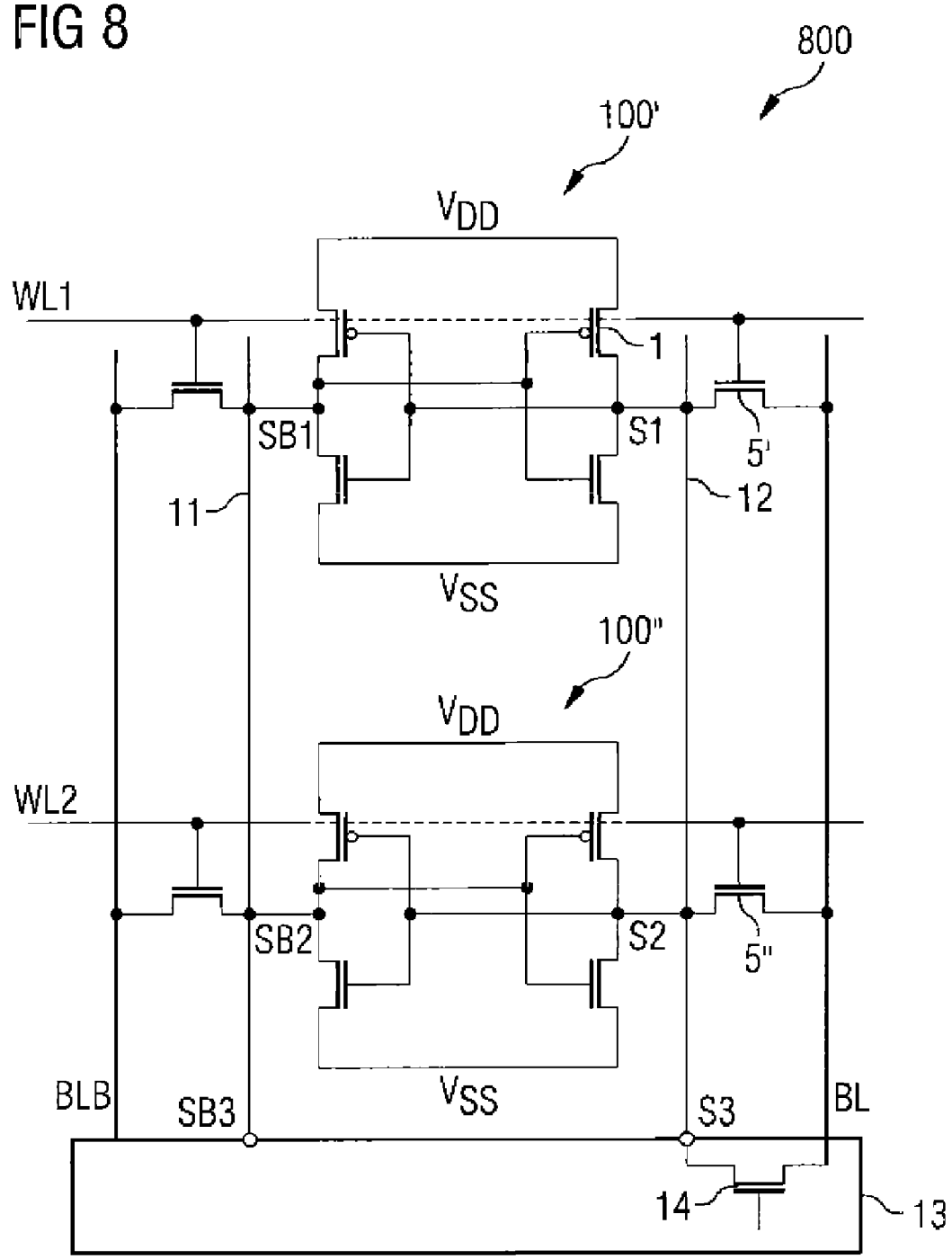
FIG. 8 schematically illustrates a device 800 as a further exemplary embodiment.

FIG. 8 schematically shows an illustrative embodiment of a device 800 that includes two reference cells 100' and 100" as shown in FIG. 1 but that do not include artificial defects. Generally, the reference cells 100' and 100" do not necessarily need to have the same write margin or be of the same type. The two reference cells 100' and 100" are arranged in a column and connected by the bitlines BL and BLB. Further, connections are established by lines 11 and 12. The line 11 connects the storage nodes SB1 and SB2, and the line 12 connects the storage nodes S1 and S2. The reference cell 100' is coupled to a wordline WL1, and the reference cell 100" is coupled to a wordline WL2. In further illustrative embodiments, the reference cells 100' and 100" may be coupled to the same wordline.

The device 800 further includes a weak write periphery 13 including auxiliary circuitry driving the reference cells 100' and 100". Generally, the device 800 may feature similar or the same functionalities as the device 600 of FIG. 6, wherein the two reference cells 100' and 100" of FIG. 8 can be identified with the reference cell 200 of FIG. 6 and the weak write periphery 13 of FIG. 8 can be thought to include the detection unit 9, the control units 8a, 8b and the memory cell 100 of FIG. 6.

The reference cells 100' and 100" are coupled to the weak write periphery 13 by the lines BLB, BL, 11 and 12, wherein the device 800 includes two further storage nodes SB3 and S3 which are arranged between the storage nodes SB2, S2 and the weak write periphery 13. The potential at the storage node SB3 corresponds to an averaged value of the potential at the storage node SB1 (for the case of only the reference cell 100' being implemented) and the potential at the storage node SB2 (for the case of only the reference cell 100" being implemented). Similarly, the potential at the storage node S3 corresponds to an average value of the potentials at the storage nodes S1 and S2. Accordingly, the write margin of the column including the reference cells 100' and 100" may be defined similarly to the write margin of a single memory cell, but it is referred to the binary states stored in the storage nodes SB3 and S3. That is to say, the write margin of the column including the reference cells 100' and 100" referred to the storage nodes SB3 and S3 corresponds to an averaged value of the write margins of the single reference cells 100' and 100". It is to be noted that further reference cells may be connected in parallel to the reference cells 100' and 100".

In contrast to the reference cell 200 of FIG. 6, the two reference cells 100' and 100" of FIG. 8 do not include artificial defects. One intention behind the defect 7 in FIG. 6 is to vary the write margin of the reference cell 200 in order to mimic a defective memory cell. In a similar way, the column including the reference cells 100' and 100" in FIG. 8 mimics a defective memory cell as well. It is to be noted that in the case of the reference cells 100' and 100" (i.e. multiple cells in a column) being of the same type, the effect of inaccuracies of the fabrication process of the cells may be averaged out.

The write margin of the column containing the memory cells 100' and 100" may be adjusted by adding further electrical components to the device 800. For example, an additional transistor 14 contained in the weak write periphery 13 may be connected in parallel to the transistors 5' and 5". It is understood that there are many further possibilities to adjust the write margin. For example, instead of adding the transistor 14, an additional resistor connected in series with the transistor 1 may be added. Moreover, apart from transistors and resistors, any other electrical components, may be used as well. The additional electrical components may be added at arbitrary locations in the device 800, such as within the memory cells 100', 100" or within the weak write periphery 13. The choice of the type of employed electrical components and their locations may depend on the desired write margin, which in turn may depend on the type of memory cells that are to be tested.

FIG. 9 schematically illustrates a device 900 as a further illustrative embodiment. The device 900 includes two reference cells 200' and 200" arranged in a column and coupled to a unit 15 that includes a detection unit and a control unit (not explicitly shown). The reference cells 200' and 200" as well as the unit 15 correspond to the left part of FIG. 6. In FIG. 9 the transistors included in the memory cells 200' and 200" are illustrated as inverters 16a', 16b', 16a" and 16b". The column including the reference cells 200' and 200" may include further reference cells and any desired number of artificial defects.

The device 900 further includes memory cells 100' and 100" as shown in FIG. 1, wherein the included transistors are again depicted as inverters. It is understood that each of the memory cells 100' and 100" may be implemented by multiple memory cells. The memory cells may be of arbitrary size and connected by wordlines and bitlines, forming an array of memory cells. The memory cells 100' and 100" may be connected to input-output (IO) units 17a and 17b, respectively, configured to establish a connection between the memory cells 100' and 100" and possible external devices (not shown).

The device 900 may further include a wordline driver 18 that controls the voltages applied to the wordlines to allow selected memory cells to be read or written. In FIG. 9, a line 20 connects the wordline driver 18 to the memory cells 100' and 100". It is to be noted that the wordline of each cell may be driven individually. In FIG. 9 the wordline driver 18 is indicated by an inverter symbol representing the output stage of the wordline driver 18. It is understood that the wordline driver 18 may contain further electrical components that are not explicitly depicted in FIG. 9. The wordline driver 18 is coupled to a control unit 19 configured to control the operation mode of the wordline driver 18.

The device 900 in this example corresponds to an embedded memory chip having a butterfly topology (thus the symmetric arrangement of the two memory cells 100' and 100"). It is understood that the described components of the device 900 may be coupled between themselves, for example by the line 20. The specific internal couplings between the components as well as the explicit circuitry of the device 900 depends on its desired overall functionality. The memory cells 100', 100" and the reference cells 200' and 200" may be integrated in the same semiconductor chip. It is to be noted that all previously described (testing) processes may be adapted to the device 900.

FIGS. 10a to 10e show various illustrative voltage characteristics that will be explained in the following. Since these voltage characteristics are associated with simultaneous processes, they are shown in graphs having a common horizontal axis depicting time in steps of 0.5 ns from 60 ns to 77.5 ns. Moreover, the vertical axis of each voltage characteristic depicts the voltage. Accordingly, the graphs shown in FIGS. 10a to 10e depict the time sequence of voltages during various processes. It is understood that the scaling of the depicted voltage characteristics is merely illustrative and provides an impression of the time and voltage scales during the considered processes.

FIG. 10a shows an illustrative voltage characteristic of a clock pulse having the form of a square wave. The clock pulse triggers the discharge of a bitline whose voltage characteristics is shown in FIG. 10b.

FIG. 10b shows an illustrative voltage characteristic of a bitline during a bitline discharge. Initially, the bitline is held at a constant voltage of about 1.2 V. The discharge process is then triggered by the clock pulse of FIG. 10a. The bitline is discharged until a time of about 68.7 ns, where it reaches a minimal voltage of about 0.5 V. The characteristic of FIG. 10a shows an increase of the voltage back to the initial value of about 1.2V at a time of about 70 ns.

FIG. 10c shows an illustrative voltage characteristic of two storage nodes of a reference cell during the bitline discharge of FIG. 10b. The reference cell may, for example, be similar to the memory cell 200 of FIG. 6 including the storage nodes S and SB. Another possible implementation of the reference cell may be the column including the two cells 100' and 100" shown in FIG. 8 and including the storage nodes S3 and SB3. Here, the initially upper voltage characteristic is dedicated to a storage node S coupled to the discharged bitline.

Initially, the storage node S is at a constant voltage of about 1.2 V, wherein a first change of the voltage is detected at the time of the clock pulse of FIG. 10a. Simultaneous to the bitline discharge, the voltage at the storage node S decreases, wherein the voltage characteristic of the storage node S is of similar shape as the voltage characteristics of the bitline shown in FIG. 10b. It is to be noted that the voltage of the storage node S does not reach a voltage of 0 V corresponding to the initial voltage of the second storage node SB. This means that the memory state stored in the reference cell is not written (or switched) during the process of the bitline discharge. Due to the cross-coupled inverters of the reference cell as they were for example shown in FIG. 9, the voltage characteristic of the second voltage node SB is of similar, but inverted shape as the voltage characteristic of the storage node S.

FIG. 10d shows an illustrative voltage characteristic of two storage nodes of a stable memory cell during the bitline discharge of FIG. 10b. Here, a memory cell is referred to as nominal (or stable or non-defective) if it does not include any defects, may they be artificially added or caused by inaccuracies of fabrication processes. Again, the initially upper voltage characteristic is dedicated to a storage node S coupled to the discharged bitline of FIG. 10b.

Initially, the storage node S is at a constant voltage of about 1.2 V. A first change in the voltage is detected at the time of the clock pulse of FIG. 10a. Since the considered memory cell is stable, its memory state is not written (or switched) during the bitline discharge. Accordingly, the voltage of the storage node S does not reach the initial voltage level of 0 V of the second storage node SB. The initial voltage of the storage node S of about 1.2 V is only slightly changed during the discharge of the bitline. The voltage characteristic of the storage node SB does not show a similar shape as the storage node S. The voltage at the storage node SB does not reach the initial voltage of the storage node S at about 1.2 V.

FIG. 10e shows an illustrative voltage characteristic of two storage nodes of an unstable memory cell during a bitline discharge. Again, the initially upper voltage characteristic is dedicated to a storage node S coupled to the discharged bitline of FIG. 10b. In contrast to the voltage characteristic of FIG. 10d, FIG. 10e shows a write (or switch) process of the memory state stored in the unstable memory cell during the discharge of the bitline. Accordingly, the final voltage of each storage node corresponds to the initial voltage of the respective other storage node. In FIG. 10e, the voltage characteristics of the two storage nodes S and SB are almost symmetric to each other.

In addition, while a particular feature or aspect of an embodiment may have been disclosed with respect to only one of several implementations, such a feature or aspect may be combined with one or more other features or aspects of the other implementations as may be desired for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from those illustrated herein.

The invention claimed is:

1. An apparatus, comprising:
 a memory cell;
 a first reference cell;
 a first control unit, coupled to the memory cell and the first reference cell, and configured to initiate write processes of the memory cell and the first reference cell; and
 a first detection unit, coupled to the first reference cell, and configured to detect a write completion of the first reference cell,
 wherein the first reference cell comprises a simulated defect.

2. The apparatus of claim 1, wherein the simulated defect is tunable.

3. The apparatus of claim 1, further comprising a second control unit, coupled to the memory cell, and configured to terminate the write processes of the memory cell and the first reference cell.

4. An apparatus, comprising:
 a memory cell;
 a first reference cell;
 a first control unit, coupled to the memory cell and the first reference cell, and configured to initiate write process of the memory cell and the first reference cell;
 a first detection unit, coupled to the first reference cell, and configured to detect a write completion of the first reference cell; and
 a second detection unit coupled to the memory cell, and configured to detect a write completion of the memory cell wherein the first reference cell comprises a simulated defect.

5. The apparatus of claim 1, further comprising a second reference cell and a reference bit line, wherein the first and the second reference cells are coupled to the reference bit line.

6. The apparatus of claim 1, wherein the memory cell and the first reference cell are integrated on the same chip.

7. A method, comprising:
 initiating write processes of a memory cell and a first reference cell; and
 detecting a write completion of the first reference cell,
 wherein the first reference cell comprises a simulated defect.

8. The method of claim 7, further comprising tuning the simulated defect.

9. The method of claim 7, wherein the memory cell is coupled to a first memory bit line and the first reference cell is coupled to a first reference bit line, the method further comprising discharging the first memory bit line and the first reference bit line during the write processes.

10. The method of claim 9, wherein discharging the first memory bit line and discharging the first reference bit line are simultaneously started.

11. The method of claim 9, wherein discharging the first memory bit line and discharging the first reference bit line are terminated when the write completion of the first reference cell is detected.

12. A method, comprising:
 initiating write process of a memory cell and a first reference cell;
 detecting a write completion of the first reference cell; and
 detecting, after the detection of the write completion of the first reference cell, whether the write process of the memory cell is completed wherein the first reference cell comprises a simulated defect.

13. The method of claim 7, wherein the memory cell is coupled to a second memory bit line and the first reference cell is coupled to a second reference bit line, and the second memory bit line and the second reference bit line have dedicated electrical potentials during the write processes.

14. The method of claim 9, wherein a second reference cell is coupled to the first reference bit line.

15. An apparatus, comprising:
 a memory cell;
 a reference cell;
 control means for initiating write processes of the memory cell and the reference cell; and
 detection means for detecting a write completion of the reference cell,
 wherein the reference cell comprises a simulated defect.

16. The apparatus of claim 1, farther comprising a second detection unit, coupled to the memory cell, and configured to detect a write completion of the memory cell.

17. The method of claim 7, further comprising detecting, after the detection of the write completion of the first reference cell, whether the write process of the memory cell is completed.

* * * * *